US009455256B2

(12) United States Patent
Heo et al.

(10) Patent No.: US 9,455,256 B2
(45) Date of Patent: Sep. 27, 2016

(54) INVERTER INCLUDING TWO-DIMENSIONAL MATERIAL, METHOD OF MANUFACTURING THE SAME AND LOGIC DEVICE INCLUDING INVERTER

(71) Applicant: Samsung Electronics Co., Ltd., Suwon-Si, Gyeonggi-Do (KR)

(72) Inventors: Jin-seong Heo, Seoul (KR); Seong-jun Park, Seoul (KR); Hyeon-jin Shin, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 14/265,769

(22) Filed: Apr. 30, 2014

(65) Prior Publication Data
US 2015/0137075 A1    May 21, 2015

(30) Foreign Application Priority Data

Nov. 21, 2013 (KR) .......................... 10-2013-0142434

(51) Int. Cl.
*H01L 27/092* (2006.01)
*H01L 29/66* (2006.01)
(Continued)

(52) U.S. Cl.
CPC ... *H01L 27/0922* (2013.01); *H01L 21/823807* (2013.01); *H01L 29/267* (2013.01);
(Continued)

(58) Field of Classification Search
CPC ........... H01L 27/0922; H01L 29/7827; H01L 21/823807; H01L 29/24; H01L 29/518
USPC ............................................ 257/29; 438/212
See application file for complete search history.

(56) References Cited

U.S. PATENT DOCUMENTS 8,513,653 B2    8/2013  Woo et al.
2011/0089403 A1*  4/2011  Woo et al. .................. 257/29
(Continued)

FOREIGN PATENT DOCUMENTS

KR   2012-0118566 A   10/2012
KR   20130032105 A    4/2013
(Continued)

OTHER PUBLICATIONS

Mark Levendorf et al, "Graphene and boron nitride lateral heterostructures for atomically thin circuitry", Nature, vol. 488, p. 627-632, Aug. 30, 2012, which is in IDS filed on Apr. 30, 2014.*

(Continued)

*Primary Examiner* — Cuong Q Nguyen
*Assistant Examiner* — Tong-Ho Kim
(74) *Attorney, Agent, or Firm* — Harness, Dickey & Pierce, P.L.C.

(57) ABSTRACT

Inverters including two-dimensional (2D) material, methods of manufacturing the same, and logic devices including the inverters. An inverter may include a first transistor and a second transistor that are connected to each other, and the first and second transistor layers may include 2D materials. The first transistor may include a first graphene layer and a first 2D semiconductor layer contacting the first graphene layer, and the second transistor may include a second graphene layer and a second 2D semiconductor layer contacting the second graphene layer. The first 2D semiconductor layer may be a p-type semiconductor, and the second 2D semiconductor layer may be an n-type semiconductor. The first 2D semiconductor layer may be arranged at a lateral side of the second 2D semiconductor layer.

22 Claims, 9 Drawing Sheets

(51) Int. Cl.
  *H01L 29/51* (2006.01)
  *H01L 21/8238* (2006.01)
  *H01L 29/78* (2006.01)
  *H01L 29/267* (2006.01)
  *H01L 29/778* (2006.01)
  *H01L 29/24* (2006.01)
  *H01L 29/16* (2006.01)

(52) U.S. Cl.
  CPC ....... *H01L29/518* (2013.01); *H01L 29/66045* (2013.01); *H01L 29/66969* (2013.01); *H01L 29/778* (2013.01); *H01L 29/7827* (2013.01); *H01L 29/1606* (2013.01); *H01L 29/24* (2013.01); *H01L 29/242* (2013.01)

(56) References Cited

U.S. PATENT DOCUMENTS

2013/0048948 A1* 2/2013 Heo et al. ............. 257/27
2013/0105824 A1 5/2013 Paranjape et al.
2014/0097403 A1 4/2014 Heo et al.
2014/0197459 A1* 7/2014 Kis et al. ............. 257/194
2015/0122315 A1 5/2015 Shin et al.

FOREIGN PATENT DOCUMENTS

KR 20130133830 A 12/2013
WO WO-2012127244 A2 9/2012

OTHER PUBLICATIONS

Min Wang, "A Platform for Large-Scale Graphene Electronics—CVD Growth of Single-Layer Graphene on CVD-Grown Hexagonal Boron Nitride", Advanced Materials, 2013, vol. 25, pp. 2746-2752.

Mark P. Levendorf, "Graphene and Boron Nitride Lateral Heterostructures for Atomically Thin Circuitry", Nature, Aug. 30, 2012, vol. 488, pp. 627-632.

Woo Jong Yu, "Vertically Stacked Multi-Heterostructures of Layered Materials for Logic Transistors and Complementary Inverters", Nature Materials, Mar. 2013, vol. 12, pp. 246-252.

* cited by examiner

INVERTER INCLUDING TWO-DIMENSIONAL MATERIAL, METHOD OF MANUFACTURING THE SAME AND LOGIC DEVICE INCLUDING INVERTER

RELATED APPLICATIONS

This application claims priority from Korean Patent Application No. 10-2013-0142434, filed on Nov. 21, 2013, in the Korean Intellectual Property Office, the disclosure of which is incorporated herein in its entirety by reference.

BACKGROUND

1. Field

Example embodiments relate to inverters and logic devices, and more particularly, to inverters including two-dimensional materials, methods of manufacturing the same, and/or logic devices including the inverters.

2. Description of the Related Art

A two-dimensional (2D) material is a single-layer or half-layer solid material in which atoms form a desired, predetermined or given crystal structure. The most well-known example of a 2D material is graphene. Graphene is a single-layer (single atomic layer) structure in which carbon atoms form a hexagonal structure. Graphene may have a band structure that is symmetrical around the Dirac point, and the effective mass of a charge at the Dirac point is very small. Therefore, graphene may have a charge mobility that is at least 10 times or higher (may be even 1000 times or higher) than a charge mobility of silicon (Si). Furthermore, graphene may have a very high Fermi velocity ($V_F$). Therefore, the graphene has drawn attention as a next-generation material that may overcome limits of materials in the related art.

Other than research on graphene, various 2D materials having insulation properties or semiconductor properties are being researched and developed. Recently, a vertical logic device employing a 2D material such as BSCO ((Ba,Sr)$CuO_4$) have been suggested. However, in the vertical logic device employing a 2D material like BSCO, it is difficult to obtain sufficiently large field effect in a vertical direction, and thus gain is low. Furthermore, it is not easy to manufacture such a vertical logic device. Meanwhile, in the case of a logic device employing silicon (Si), lithography and ion implantation processes are required. Furthermore, since there is no technique for depositing silicon (crystalline silicon) onto a 2D material, a monocrystalline silicon substrate may be used to manufacture the logic device.

SUMMARY

At least one example embodiment includes high performance inverters including two-dimensional (2D) materials.

Provided are example inverters, which may be driven at low voltages and exhibit high mobility.

Provided are example inverters including graphene and 2D semiconductors.

Provided are example inverters that may be easily manufactured.

Provided are example inverters that may be formed as flexible devices.

Provided are example inverters that may be formed as transparent devices.

Provided are methods of manufacturing the inverters, according to at least one example embodiment.

Provided are example logic devices including the inverters.

Additional example embodiments will be set forth in part in the description which follows and, in part, will be apparent from the description, or may be learned by practice of the example embodiments.

According to at least one example embodiment, an inverter includes a first transistor and a second transistor that are connected to each other, wherein the first transistor includes a first channel unit, the first channel unit includes a first graphene layer and a p-type first 2D semiconductor layer contacting the first graphene layer, and wherein the second transistor includes a second channel unit arranged laterally with respect to the first channel unit, and the second channel unit includes a second graphene layer and an n-type second 2D semiconductor layer contacting the second graphene layer.

The first 2D semiconductor layer may be chemically bonded to a side of the second 2D semiconductor layer.

The first 2D semiconductor layer and the second 2D semiconductor layer may be laterally arranged to be apart from each other.

The first 2D semiconductor layer may include a first metal chalcogenide-based material, and the second 2D semiconductor layer may include a second metal chalcogenide-based material.

The first metal chalcogenide-based material and the second metal chalcogenide-based material may include different metal atoms from each other.

The first metal chalcogenide-based material and the second metal chalcogenide-based material may include a same chalcogen atom.

The first metal chalcogenide-based material may include at least one of $WS_2$, $ZrS_2$, $ZrSe_2$, $HfS_2$, $HfSe_2$, and $NbSe_2$, for example.

The second metal chalcogenide-based material may include at least one of $MoS_2$, $MoSe_2$, $MoTe_2$, $WSe_2$, and $WTe_2$, for example.

The first and second graphene layers may be arranged apart from each other, an insulator may be arranged between the first and second graphene layers, and the first and second 2D semiconductor layers may be arranged on the first and second graphene layers and the insulator. The insulator may include hexagonal boron nitride (h-BN).

The first and second graphene layers may be arranged apart from each other, and a portion of the first 2D semiconductor layer and a portion of the second 2D semiconductor layer extend between the first and second graphene layers.

The first and second graphene layers may be arranged apart from each other, the first and second 2D semiconductor layers may be arranged apart from each other, and the inverter may further include an insulator arranged between the first and second graphene layers and between the first and second 2D semiconductor layers. The insulator may include hexagonal boron nitride (h-BN).

The inverter may include a common gate electrode apart from the first and second graphene layers; a gate insulation layer arranged between the common gate electrode and the first and second graphene layers; and a plurality of electrodes arranged on the first and second graphene layers and the first and second 2D semiconductor layers.

The plurality of electrodes may include a first electrode, which may be arranged on the first graphene layer and may be connected to a power supply terminal; a second electrode, which may be arranged on the second graphene layer and may be grounded; and a third electrode, which may be arranged on the first and second 2D semiconductor layers and may be connected to an output terminal.

The gate insulation layer may include a 2D material.

According to at least one example embodiment, a logic device including the inverter is provided. The logic device may be one of a NAND device, a NOR device, an encoder, a decoder, a multiplexer (MUX), a de-multiplexer (DE-MUX), a sense amplifier, and an oscillator, for example.

According to at least one example embodiment, a method of manufacturing an inverter including first and second transistors connected to each other, the method includes forming first and second graphene layers on a substrate to be apart from each other; forming a p-type first 2D semiconductor layer and an n-type second 2D semiconductor layer respectively contacting the first and second graphene layers; and forming a plurality of electrodes on the first and second graphene layers and the first and second 2D semiconductor layers, wherein the first transistor is formed to include the first graphene layer and the first 2D semiconductor layer, and the second transistor is formed to include the second graphene layer and the second 2D semiconductor layer.

The forming of the first and second 2D semiconductor layers may include forming a thin film including a first metal oxide and a second metal oxide; and forming a first metal chalcogenide-based material and a second metal chalcogenide-based material from the first metal oxide and the second metal oxide, respectively, wherein the first metal chalcogenide-based material corresponds to the first 2D semiconductor layer, and the second metal chalcogenide-based material corresponds to the second 2D semiconductor layer.

The forming of the first metal chalcogenide-based material and the second metal chalcogenide-based material respectively from the first metal oxide and the second metal oxide may include injecting a chalcogen-based material into a chamber in which the thin film is arranged; and annealing the thin film.

The annealing may be performed at a temperature in a range of about 300° C. to about 2000° C.

The first 2D semiconductor layer may be chemically bonded to a side of the second 2D semiconductor layer.

The first 2D semiconductor layer and the second 2D semiconductor layer may be laterally arranged to be apart from each other.

The substrate may include a common gate electrode apart from the first and second graphene layers; and a gate insulation layer arranged between the common gate electrode and the first and second graphene layers.

The forming of the first and second transistors may include forming a graphene layer; forming the first and second graphene layers by patterning the graphene layer; forming an insulator between the first and second graphene layers; and forming the first and second 2D semiconductor layers on the first and second graphene layers and the insulator.

The forming of the first and second transistors may include forming a graphene layer; forming the first and second graphene layers by patterning the graphene layer; and forming the first and second 2D semiconductor layers on the first and second graphene layers, wherein a portion of the first 2D semiconductor layer and a portion of the second 2D semiconductor layer may extend between the first and second graphene layers.

The forming of the first and second transistors may include forming a graphene layer; forming a 2D semiconductor layer on the graphene layer; forming the first and second 2D semiconductor layers and the first and second graphene layers by patterning the graphene layer and the 2D semiconductor layer; and forming an insulator between the first and second graphene layers and between the first and second 2D semiconductor layers.

BRIEF DESCRIPTION OF THE DRAWINGS

These and/or other features will become apparent and more readily appreciated from the following description of the example embodiments, taken in conjunction with the accompanying drawings in which.

DETAILED DESCRIPTION

Figure 1:
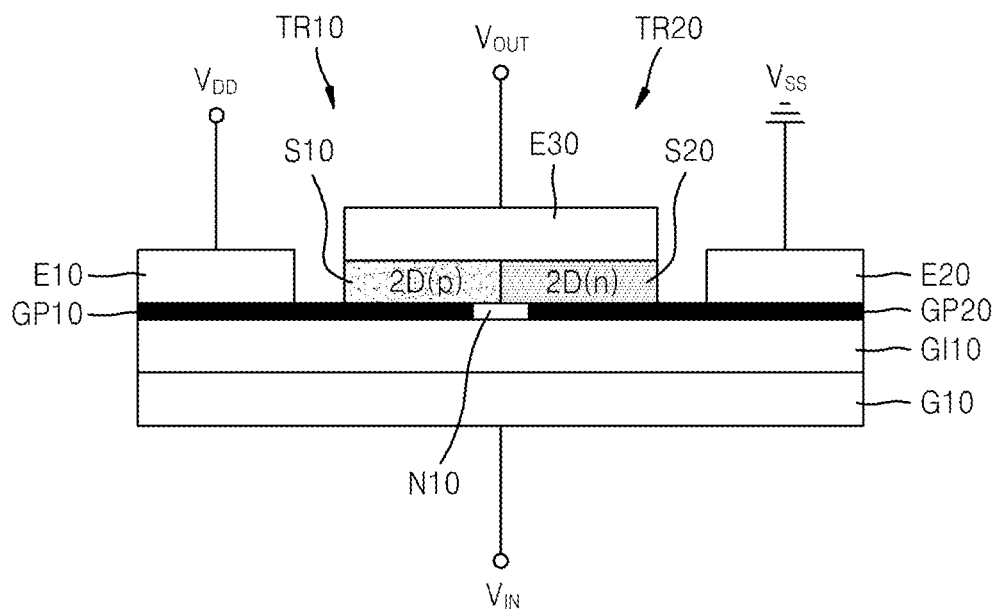
FIG. 1 is a cross-sectional view of an inverter according to an example embodiment.

Various example embodiments will now be described more fully with reference to the accompanying drawings in which example embodiments are shown.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the embodiments are merely described below, by referring to the figures, to explain features of the present description.

FIG. 1 is a cross-sectional view of an inverter according to an example embodiment.

Referring to FIG. 1, the inverter according to the example embodiment may include a first transistor TR10 and a second transistor TR20 connected thereto. The first transistor TR10 may include a first channel unit, and the first channel unit may include a first graphene layer GP10 and a first 2D semiconductor layer S10 contacting the first graphene layer GP10. The first 2D semiconductor layer S10 may be a p-type semiconductor. The second transistor TR20 may include a second channel unit, and the second channel unit may include a second graphene layer GP20 and a second 2D semiconductor layer S20 contacting the second graphene layer GP20. The second 2D semiconductor layer S20 may be an n-type semiconductor. The first graphene layer GP10 and the second graphene layer GP20 may be arranged to be laterally apart from each other. The first graphene layer GP10 and the second graphene layer GP20 may have same material properties. The first 2D semiconductor layer S10 and the second 2D semiconductor layer S20 may be attached (bonded) to each other. The second 2D semiconductor layer S20 may be attached (bonded) to a side of the first 2D semiconductor layer S10. Therefore, the first 2D semiconductor layer S10 and the second 2D semiconductor layer S20 may be laterally arranged. The first 2D semiconductor layer S10 may be chemically bonded to the second 2D semiconductor layer S20. In other words, the first 2D semiconductor layer S10 may be chemically bonded to a side (side surface) of the second 2D semiconductor layer S20. The chemical bond may be a "covalent bond." Therefore, the first 2D semiconductor layer S10 may be covalently bonded to the second 2D semiconductor layer S20. The first 2D semiconductor layer S10 and the second 2D semiconductor layer S20 may have an interatomically bonded structure to have a continuous crystal structure at a bonding portion therebetween. As the first transistor TR10 and the second transistor TR20 are laterally arranged, and the channel units (the first channel unit and the second channel unit) of both the first transistor TR10 and the second transistor TR20 are formed of 2D materials, the inverter including the first transistor TR10 and the second transistor TR20 may have excellent performance and operation characteristics, and various advantages may be expected in terms of manufacturing process, for example. Detailed descriptions thereof will be given later.

Configuration of an inverter according to an example embodiment will be described below in closer detail. A common gate electrode G10 may be arranged apart from the first graphene layer GP10 and the second graphene layer GP20. A gate insulation layer GI10 may be arranged between the common gate electrode G10 and the first and second graphene layers GP10 and GP20. The gate insulation layer GI10 may be arranged on the common gate electrode G10, and the first and second graphene layers GP10 and GP20 apart from each other may be arranged on the gate insulation layer GI10. The common gate electrode G10 may be a conductor substrate. The common gate electrode G10 may be formed of a conductive 2D material or a non-2D material (referred to hereinafter as a 'bulk material'). For example, the common gate electrode G10 may be formed of a metal, such as Cu, Ni, Fe, Co, Pt, or Ru, or may be formed of graphene. Alternatively, the common gate electrode G10 may be formed of a doped silicon (Si). The gate insulation layer GI10 may be formed of an insulating 2D material or a bulk material, which is a non-2D material. For example, the gate insulation layer GI10 may be formed of an insulating 2D material, such as hexagonal boron nitride (h-BN). However, in other cases, the gate insulation layer GI10 may be formed of an insulating material, such as $SiO_2$, $SiN_x$, AlN, $Al_2O_3$, $HfO_2$, or $ZrO_2$. The common gate electrode G10 and the gate insulation layer GI10 may be considered together as a single substrate. Alternatively, a separate substrate (not shown) may be further provided on a lower surface of the common gate electrode G10.

The first and second graphene layers GP10 and GP20 may include about 1 layer to about 10 layers (or about 1 layer to about 5 layers) of graphene. In other words, the first and second graphene layers GP10 and GP20 may be formed as single graphene, or may have a stack of a plurality of graphene layers less than or equal to about 10 layers (or about 5 layers). Even if a few layers (within about 10 layers) of graphene are stacked, unique material properties of graphene may be maintained.

An insulator N10 may be disposed between the first and second graphene layers GP10 and GP20. The insulator N10 may include a 2D material. For example, the insulator N10 may include h-BN. Accordingly, a "graphene/h-BN/graphene" structure may be provided on the gate insulation layer GI10. However, a material constituting the insulator N10 is not limited to h-BN and may vary. Furthermore, the insulator N10 may be formed of a non-2D material.

The first and second 2D semiconductor layers S10 and S20 may be arranged on the first and second graphene layers GP10 and GP20, with the insulator N10 disposed therebetween. The first 2D semiconductor layer S10 may be arranged on an end portion of the first graphene layer GP10 and may extend onto the insulator N10. Similarly, the second 2D semiconductor layer S20 may be arranged on an end portion of the second graphene layer GP20 and may extend onto the insulator N10. The first 2D semiconductor layer S10 may be formed of a first metal chalcogenide-based material, and the second 2D semiconductor layer S20 may be formed of a second metal chalcogenide-based material. The first and second metal chalcogenide-based materials may be transition metal dichalcogenide (TMDC) materials. At least one of the first and second metal chalcogenide-based materials may include a transition metal selected from Mo, W, Nb, V, Ta, Ti, Zr, Hf, Tc, and Re and a chalcogen atom selected from S, Se, and Te. The TMDC material may be expressed as $MX_2$, where M denotes a transition metal and X denotes a chalcogen atom. M may be Mo, W, Nb, V, Ta, Ti, Zr, Hf, Tc, or Re, whereas X may be S, Se, or Te. The TMDC material may be $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, or $ReSe_2$, for example. The first and second metal chalcogenide-based materials may not be expressed as $MX_2$. For example, a compound of Cu (transition metal) and S (chalcogen atom) may be expressed as CuS which is a transition metal chalcogenide material. The CuS may also be a 2D material, and thus CuS may also be applied as the first metal chalcogenide-based material or the second metal chalcogenide-based material. Alternatively, the first metal chalcogenide-based material and the second metal chalcogenide-based material may be chalcogenide materials including non-transition metals. The non-transition metal may be Ga, In, Sn, Ge, or Pb, for example. In other words, compounds including a non-transition metal, such as Ga, In, Sn, Ge, and Pb, and a chalcogen atom, such as S, Se, and Te, may be used as the first and second metal chalcogenide-based materials. The chalcogenide material including the non-transition metal may be $SnSe_2$, GaS, GaSe, GaTe, GeSe, $In_2Se_3$, or $InSnS_2$, for example.

According to an example embodiment, the first 2D semiconductor layer S10 may be a p-type semiconductor, whereas the second 2D semiconductor layer S20 may be an n-type semiconductor. The first metal chalcogenide-based material of the first 2D semiconductor layer S10 and the second metal chalcogenide-based material of the second 2D semiconductor layer S20 may include different metal atoms from each other. Furthermore, the first metal chalcogenide-based material of the first 2D semiconductor layer S10 and the second metal chalcogenide-based material of the second 2D semiconductor layer S20 may include a same chalcogen atom. The first 2D semiconductor layer S10 may include a first metal atom and a first chalcogen atom, and the second 2D semiconductor layer S20 may include a second metal atom and a second chalcogen atom. Here, the first metal atom and the second metal atom may be different from each other, whereas the first chalcogen atom and the second chalcogen atom may be the same. If a metal atom of a metal chalcogenide material is changed, conductive type (p or n) of the metal chalcogenide material may be changed. Therefore, if the first 2D semiconductor layer S10 is p-type and the second 2D semiconductor layer S20 is n-type, the first 2D semiconductor layer S10 and the second 2D semiconductor layer S20 may include different metal atoms. However, in case of some metal atoms, the polarity or conductivity type (p or n) may be changed as chalcogen atom bonded to such a metal atom is changed. Therefore, in some cases, the first metal atom and the second metal atom may be the same, whereas the first chalcogen atom and the second chalcogen atom may be different from each other.

The first 2D semiconductor layer S10 may include at least one of $WS_2$, $ZrS_2$, $ZrSe_2$, $HfS_2$, $HfSe_2$, and $NbSe_2$ as a metal chalcogenide-based material having p-type semiconductor properties. The second 2D semiconductor layer S20 may include at least one of $MoS_2$, $MoSe_2$, $MoTe_2$, $WSe_2$, and $WTe_2$ as a metal chalcogenide-based material having n-type semiconductor properties. For example, the first 2D semiconductor layer S10 may include $WS_2$ having p-type semiconductor properties, and the second 2D semiconductor layer S20 may include $MoS_2$ having n-type semiconductor properties. Mo and W are metals of the same group, and a difference between atomic sizes thereof (difference between covalent radiuses: 0.08 Å) is significantly smaller than a distance (1.54 Å) between the metal (Mo) and S. Therefore, even if the central metal atom is changed, lattice mismatch may rarely occur. Therefore, when $MoS_2$ and $WS_2$ are chemically bonded to each other, there may be no or little lattice mismatch at a bonding portion therebetween. Here, Mo and W have a same atomic radius of 139 picometers (pm), covalent radius of Mo is 154±5 pm, and covalent radius of W is 162±7 pm.

Table 1 below shows examples of metal chalcogenide-based materials having p-type semiconductor property and metal chalcogenide-based materials having n-type semiconductor property.

TABLE 1

| Class | Examples of Metal Chalcogenide-Based Materials |
|---|---|
| p-type semiconductor | $WS_2$, $ZrS_2$, $ZrSe_2$, $HfS_2$, $HfSe_2$, $NbSe_2$ |
| n-type semiconductor | $MoS_2$, $MoSe_2$, $MoTe_2$, $WSe_2$, $WTe_2$ |

At least one of the first and second 2D semiconductor layers S10 and S20 may be doped with a p-type dopant or an n-type dopant. If the first 2D semiconductor layer S10 is p-type semiconductor, the first 2D semiconductor layer S10 may be doped with a p-type dopant. If necessary, the first 2D semiconductor layer S10 may be doped with an n-type dopant. Similarly, if the second 2D semiconductor layer S20 is an n-type semiconductor, the second 2D semiconductor layer S20 may be doped with an n-type dopant or may be doped with a p-type dopant. For example, if the first 2D semiconductor layer S10 is $WS_2$ (p-type), the first 2D semiconductor layer S10 may be doped with $AuCl_3$, which is a p-type dopant, or K, which is an n-type dopant. In other words, the first 2D semiconductor layer S10 or the second 2D semiconductor layer S20 may be doped with a same type dopant or an opposite type dopant. Semiconductor type of a material may be changed by doping an opposite type dopant.

Furthermore, each of the first and second 2D semiconductor layers S10 and S20 may have a single layer structure (2D planar structure) or a structure in which the single layer structures (2D planar structures) are repeatedly stacked. Even if the single layer structures are repeatedly stacked, material properties of a 2D material may be maintained. In terms of electronic structure, a 2D material may be defined as a material of which density of state (DOS) complies with the quantum well behavior. Since DOS may comply with the quantum well behavior even if a plurality of unit 2D material layers are stacked (up to about 100 layers), a structure in which the single layer structures (2D planar structures) are repeatedly stacked may also be referred to as a '2D material.'

A first electrode E10 may be arranged on the first graphene layer GP10, and a second electrode E20 may be arranged on the second graphene layer GP20. A third electrode E30 may be arranged on the first and second 2D semiconductor layers S10 and S20. The third electrode E30 may contact both the first and second 2D semiconductor layers S10 and S20. Therefore, the third electrode E30 may be considered a common electrode. The first electrode E10 may be a drain electrode of the first transistor TR10 (referred to hereinafter as 'first drain electrode'). The third electrode E30 may include a source electrode of the first transistor TR10 (referred to hereinafter as 'first source electrode'). In other words, the third electrode E30 may function as the first source electrode with respect to the first transistor TR10. The third electrode E30 may include a drain electrode of the second transistor TR20 (referred to hereinafter as 'second drain electrode'). In other words, the third electrode E30 may function as the second drain electrode with respect to the second transistor TR20. The second electrode E20 may be a source electrode of the second transistor TR20 (referred to hereinafter as 'second source electrode'). The first through third electrodes E10, E20, and E30 may be formed of any of various metals or metal compounds. Furthermore, the first through third electrodes E10, E20, and E30 may also be formed of conductive 2D materials or bulk materials, which are non-2D materials.

The first graphene layer GP10, the first 2D semiconductor layer S10, the common gate electrode G10, the gate insulation layer GI10, the first electrode E10, and a portion of the third electrode E30 may constitute the first transistor TR10. The first transistor TR10 may be a p-type transistor. The second graphene layer GP20, the second 2D semiconductor layer S20, the common gate electrode G10, the gate insulation layer GI10, the second electrode E20, and the other portion of the third electrode E30 may constitute the second transistor TR20. The second transistor TR20 may be an n-type transistor. Based on a voltage applied to the common gate electrode G10, an electric barrier between the first graphene layer GP10 and the first 2D semiconductor layer S10 may be controlled, and the first transistor TR10 may be turned on or off. Similarly, based on a voltage applied to the common gate electrode G10, an electric barrier between the second graphene layer GP20 and the second 2D semiconductor layer S20 may be controlled, and the second transistor TR20 may be turned on or off. If thicknesses of the first and second 2D semiconductor layers S10 and S20 are relatively small (e.g., equal to or below about 5 nm), the first and second transistors TR10 and TR20 may become tun-neling barrier devices. If thicknesses of the first and second 2D semiconductor layers S10 and S20 are relatively large (e.g., ~several tens of nm), the first and second transistors TR10 and TR20 may become Schottky barrier devices.

The first electrode E10 may be connected to a power supply terminal $V_{DD}$. The second electrode E20 may be connected to a ground terminal $V_{SS}$. In other words, the second electrode E20 may be grounded. The common gate electrode G10 may be connected to an input terminal $V_{IN}$. The third electrode E30 may be connected to an output terminal $V_{OUT}$. According to an input signal (voltage) applied to the common gate electrode G10 via the input terminal $V_{IN}$, the first and second transistors TR10 and TR20 may be turned on or off and a signal output via the output terminal $V_{OUT}$ may be changed. For example, when a signal corresponding to '1' is input to the input terminal $V_{IN}$, a signal corresponding to '0' may be output via the output terminal $V_{OUT}$. When a signal corresponding to '0' is input to the input terminal $V_{IN}$, a signal corresponding to '1' may be output via the output terminal $V_{OUT}$. Therefore, the device shown in FIG. 1 may function as an inverter.

Figure 2:
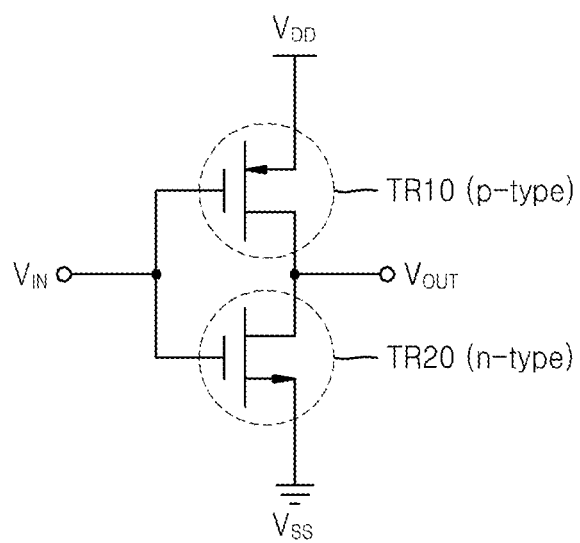
FIG. 2 is an example circuit diagram showing circuit configuration of the inverter of FIG. 1.

FIG. 2 is a circuit diagram showing circuit configuration of the inverter of FIG. 1, according to at least one example embodiment.

Referring to FIG. 2, the first transistor TR10 and the second transistor TR20 are connected to each other. The first transistor TR10 may be p-type, whereas the second transistor TR20 may be n-type. The power supply terminal $V_{DD}$ may be connected to the drain of the first transistor TR10. The output terminal $V_{OUT}$ may be connected to the source of the first transistor TR10 and the drain of the second transistor TR20. The ground terminal $V_{SS}$ may be connected to the source of the second transistor TR20. The input terminal $V_{IN}$ may be connected to gate electrodes (common gate electrode) of the first and second transistors TR10 and TR20. As described above, based on an input signal (voltage) applied to the common gate electrode via the input terminal $V_{IN}$, the first and second transistors TR10 and TR20 may be turned on or off and a signal output via the output terminal $V_{OUT}$ may be changed. The circuit configuration shown in FIG. 2 may also be applied to the structures to be described below with reference to FIGS. 3 and 4.

Various modifications may be made in the inverter structure shown in FIG. 1. For example, the insulator N10 between the first and second graphene layers GP10 and GP20 may be omitted, and the first and second 2D semiconductor layers S10 and S20 may extend between the first and second graphene layers GP10 and GP20. An example thereof is shown in FIG. 3.

Figure 3:
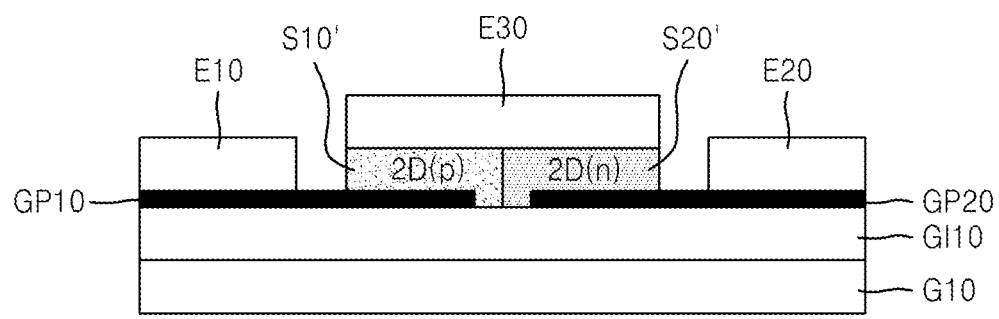
FIG. 3 is a cross-sectional view of an inverter according to another example embodiment.

Referring to FIG. 3, according to at least one example embodiment, the first and second graphene layers GP10 and GP20 are apart from each other, and a portion of a first 2D semiconductor layer S10' and a portion of a second 2D semiconductor layer S20' extend between the first and second graphene layers GP10 and GP20. The first 2D semiconductor layer S10' and the second 2D semiconductor layer S20' may contact the gate insulation layer GI10. Materials constituting the first 2D semiconductor layer S10' and the second 2D semiconductor layer S20' may be identical to the materials constituting the first and second 2D semiconductor layers S10 and S20 of FIG. 1, respectively.

In FIGS. 1 through 3, the second 2D semiconductor layer S20 or S20' may be attached (bonded) to a side of the first 2D semiconductor layer S10 or S10'. The first 2D semiconductor layer S10 or S10' may be chemically bonded to the second 2D semiconductor layer S20 or S20'. The term "chemical bond" refers to a force (attraction) which applies between atoms in a group of atoms or atom groups, so that the group may be considered as a single unit body. In other words, the term "chemical bond" refers to an inter-atomic bond for forming a molecule or a crystal by connecting atoms. Alternatively, the term "chemical bond" refers to a bonding of atoms for forming a chemical substance including two or more atoms. Such a chemical bond is basically induced by electrostatic force between atoms, where a bonding force may vary based on bonding manners. According to an example embodiment, the first 2D semiconductor layer S10 or S10' may be chemically bonded to the second 2D semiconductor layer S20 or S20', where the chemical bonding may include covalent bonding. Covalent bonding is an attraction force induced by electron pairs shared by two atoms constituting a bond and features relatively strong bonding force. According to an example embodiment, atoms of the first 2D semiconductor layer S10 or S10' and atoms of the second 2D semiconductor layer S20 or S20' may be chemically bonded to each other, and thus continuous crystal structure may be formed at a bonding portion therebetween. The first 2D semiconductor layer S10 or S10' and the second 2D semiconductor layer S20 or S20' may be a continuous crystal structure through the whole region including the bonding portion therebetween. On the contrary the term "physical contact" refers herein to two different material layers physically contact each other while unique properties of the two different material layers are maintained, where there is no inter-atomic bonding (chemical bonding) between the two material layers, and a discontinuous structure may be formed at the interface between the two material layers. The physical contact may be, for example, contact between surfaces due to the van der Waals force.

In the example embodiments shown in FIGS. 1 and 3, the cases in which the first 2D semiconductor layer S10 or S10' and the second 2D semiconductor layer S20 or S20' are attached (bonded) to each other are shown and described. However, according to another example embodiment, the first 2D semiconductor layer S10 or S10' and the second 2D semiconductor layer S20 or S20' may be apart from each other. An example thereof is shown in FIG. 4.

Figure 4:
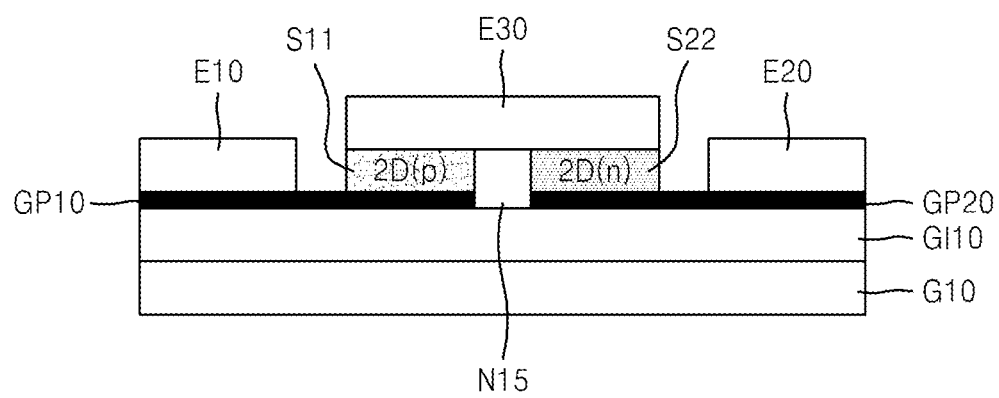
FIG. 4 is a cross-sectional view of an inverter according to another example embodiment.

Referring to FIG. 4, according to at least one example embodiment, first and second graphene layers GP10 and GP20 are apart from each other, and first and second 2D semiconductor layers S11 and S22 are apart from each other. An insulator N15 may be arranged between the first and second graphene layers GP10 and GP20 and between the first and second 2D semiconductor layers S11 and S22. The insulator N15 may be formed of a material that is the same as or similar to the material constituting the insulator N10 of FIG. 1. For example, the insulator N15 may be formed of h-BN. However, the material constituting the insulator N15 is not limited thereto and may vary. The other configurations shown in FIG. 4 may be the same as or similar to those shown in FIG. 1.

An inverter according to the example embodiment described above may include two transistors that are arranged in a horizontal direction, and channel units of both of the transistors may be formed of 2D materials. Therefore, the inverter may exhibit high performance, and be able to be operated at a low voltage, and may have high mobility characteristic. The inverter according to an example embodiment may have various advantages compared to a vertical-type inverter in the related art. Since two semiconductor layers are arranged in a vertical direction in a vertical-type inverter in the related art, it is difficult to obtain sufficient field effect in a vertical direction, gain is low, and manufacturing the inverter is relatively difficult. An inverter according to an example embodiment may exhibit excellent performance, and may be easily manufactured. Meanwhile, in case of an inverter in the related art to which silicon is applied, lithography and ion implantation processes are required, and there is no technique for depositing silicon (crystalline silicon) on a 2D material. Therefore, it is necessary to use a monocrystalline silicon substrate. However, in case of an inverter according to an example embodiment, it is not necessary to perform ion implantation and it is not necessary to use a silicon substrate. Therefore, manufacturing the example inverter is relatively easy and inexpensive, and the inverter may be applied to various fields. For example, a flexible device (inverter) may be manufactured by using a flexible substrate.

In the inverters according to example embodiments described above, all of the gate insulation layer GI10, the graphene layers GP10 and GP20, and the 2D semiconductor layers S10/S10'/S11 and S20/S20'/S22 may be formed of 2D materials and may have thicknesses smaller than or equal to about 10 nm. Therefore, the inverter including the layers may become flexible and transparent. Furthermore, the common gate electrode G10 and the electrodes E10, E20, and E30 may also be flexible and transparent. Therefore, an inverter according to an example embodiment may be manufactured as a flexible device and/or a transparent device. Furthermore, since a plurality of inverters may be easily manufactured at a large-scale substrate, productivity and cost efficiency may be improved.

FIGS. 5A through 5E are cross-sectional views showing a method of manufacturing an inverter according to at least one example embodiment.

Figure 5A:
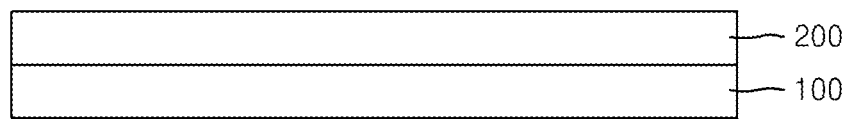
FIGS. 5A through 5E are cross-sectional views showing a method of manufacturing an inverter according to an example embodiment.

Referring to FIG. 5A, a gate insulation layer 200 may be formed on a common gate electrode 100. The common gate electrode 100 may be a conductor substrate. For example, the common gate electrode 100 may be formed of a metal (catalyst metal), such as Cu, Ni, Fe, Co, Pt, and Ru. The catalyst metal may be a base material for growing a 2D insulator, such as h-BN. However, materials for forming the common gate electrode 100 are not limited thereto and may vary. The gate insulation layer 200 may be formed of an insulating 2D material, such as h-BN. The gate insulation layer 200 may be formed via a chemical vapor deposition (CVD) method. If the common gate electrode 100 is formed of a catalyst metal stated above, an insulating 2D material, such as h-BN, (that is, the gate insulation layer 200) may be easily formed thereon. The common gate electrode 100 and the gate insulation layer 200 may be considered together as a single substrate. Furthermore, an additional substrate (not shown) may be further provided on a lower surface of the common gate electrode 100.

Figure 5B:
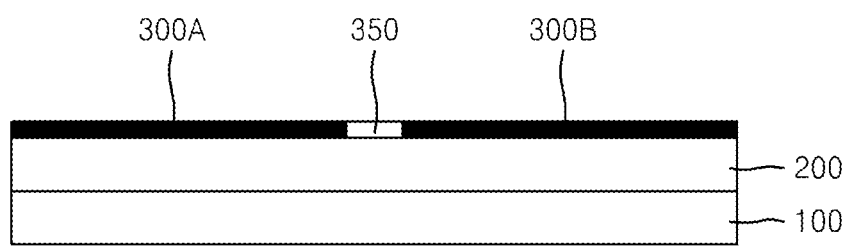

Referring to FIG. 5B, first and second graphene layers 300A and 300B may be formed on the gate insulation layer 200 apart from each other, according to at least one example embodiment. An insulator 350 may be formed on a portion of the gate insulation layer 200 between the first and second graphene layers 300A and 300B. For example, the first and second graphene layers 300A and 300B may be formed by forming a graphene layer on an entire upper surface of the gate insulation layer 200 and patterning the graphene layer. The graphene layer may be formed via CVD or pyrolysis. If the gate insulation layer 200 is formed of a 2D material, such as h-BN, the graphene layer may be easily grown thereon. After the first and second graphene layers 300A and 300B that are apart from each other are formed, the insulator 350 may be formed therebetween. The insulator 350 may be formed of a 2D material, such as h-BN. If the insulator 350 is formed of h-BN, it may be said that the first and second graphene layers 300A and 300B and the insulator 350 therebetween form a lateral heterojunction graphene/h-BN/graphene structure. However, a material for forming the insulator 350 is not limited to h-BN and may vary.

Figure 5C:
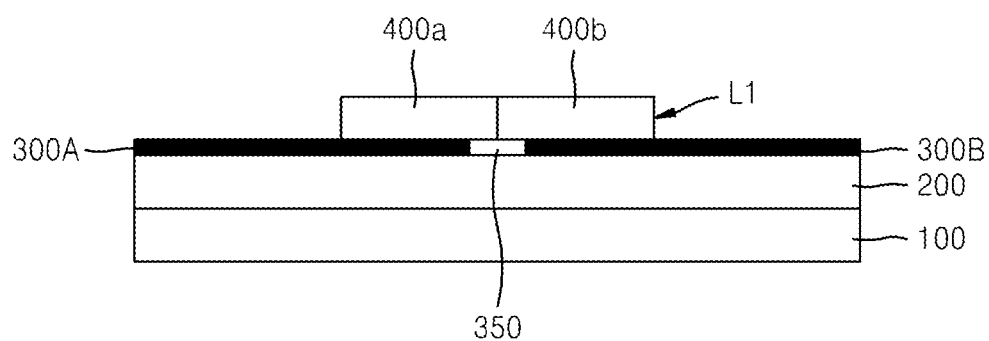

Referring to FIG. 5C, a thin film L1 may be formed on the first and second graphene layers 300A and 300B and the insulator 350, according to at least one example embodiment. The thin film L1 may include a first metal oxide 400a and a second metal oxide 400b. The first metal oxide 400a may contact the first graphene layer 300A and extend to cover a portion of the insulator 350. The second metal oxide 400b may contact the second graphene layer 300B and extend to cover the other portion of the insulator 350. The first metal oxide 400a may include an oxide of a material from among Mo, W, Nb, V, Ta, Ti, Zr, Hf, Tc, Re, Cu, Ga, In, Sn, Ge, and Pb, for example. The second metal oxide 400b may include an oxide of another material from among Mo, W, Nb, V, Ta, Ti, Zr, Hf, Tc, Re, Cu, Ga, In, Sn, Ge, and Pb, for example. For example, the first metal oxide 400a may be formed of $WO_3$, whereas the second metal oxide 400b may be formed of $MoO_3$.

Figure 5D:
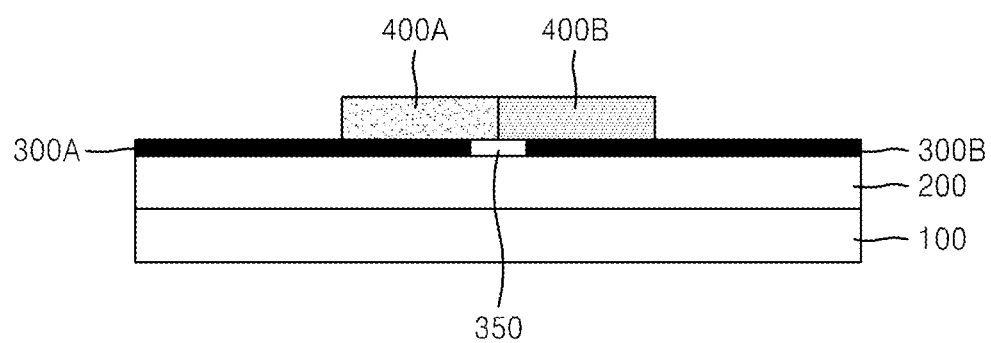

Referring to FIG. 5D, a first 2D semiconductor layer 400A including a first metal chalcogenide-based material and a second 2D semiconductor layer 400B including a second metal chalcogenide-based material may be formed by forming the first and second metal chalcogenide-based materials from the first and second metal oxides 400a and 400b, respectively, according to at least one example embodiment. The second 2D semiconductor layer 400B may be chemically bonded to a side of the first 2D semiconductor layer 400A. The first 2D semiconductor layer 400A and the second 2D semiconductor layer 400B may correspond to the first 2D semiconductor layer S10 and the second 2D semiconductor layer S20 of FIG. 1, respectively. The first 2D semiconductor layer 400A may be a p-type semiconductor, and the second 2D semiconductor layer 400B may be an n-type semiconductor.

To form the first 2D semiconductor layer 400A and the second 2D semiconductor layer 400B from the first metal oxide 400a and the second metal oxide 400b, respectively, an annealing operation may be performed while a chalcogen-based material is being injected into a reaction chamber (annealing chamber). The chalcogen-based material may include one of S, Se, and Te, for example. If the first metal oxide 400a and the second metal oxide 400b are $WO_3$ and $MoO_3$, respectively, and metal chalcogenide-based materials to be formed are $WS_2$ and $MoS_2$, the chalcogen-based material may include sulfur (S). In other words, $WO_3$ and $MoO_3$ may be changed to $WS_2$ and $MoS_2$, respectively, by performing an annealing operation with respect to the thin film L1 while S is being supplied into a reaction chamber (annealing chamber). $WS_2$ is an example of the first 2D semiconductor layer 400A, and $MoS_2$ is an example of the second 2D semiconductor layer 400B. Types of the first 2D semiconductor layer 400A and the second 2D semiconductor layer 400B may vary according to materials constituting the first metal oxide 400a and the second metal oxide 400b and the chalcogen-based material. The annealing operation may be performed at a temperature in a range of about 300° C. to about 2000° C. An additional annealing operation may also be performed afterward. The additional annealing operation may also be performed at a temperature in a range of about 300° C. to about 2000° C.

Figure 5E:
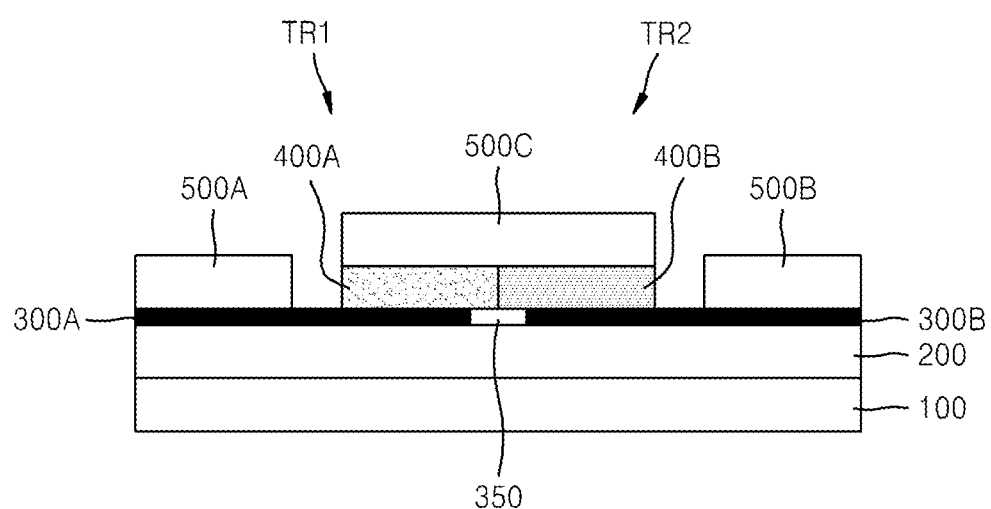

Referring to FIG. 5E, a plurality of electrodes 500A, 500B, and 500C may be formed on the first and second graphene layers 300A and 300B and the first and second 2D semiconductor layers 400A and 400B, according to at least one example embodiment. In detail, a first electrode 500A, which is apart from the first 2D semiconductor layer 400A, may be formed on the first graphene layer 300A, and a second electrode 500B, which is apart from the second 2D semiconductor layer 400B, may be formed on the second graphene layer 300B. Furthermore, a third electrode 500C contacting both the first and second 2D semiconductor layers 400A and 400B may be formed on the first and second 2D semiconductor layers 400A and 400B. The first through third electrodes 500A, 500B, and 500C may correspond to the first through third electrodes E10, E20, and E30 of FIG. 1, respectively. Although not shown, the first electrode 500A may be connected to a power supply terminal, the second electrode 500B may be grounded, and the third electrode 500C may be connected to an output terminal. The common gate electrode 100 may be connected to an input terminal.

In FIG. 5E, the first graphene layer 300A, the first 2D semiconductor layer 400A, the common gate electrode 100, the gate insulation layer 200, the first electrode 500A, and a portion of the third electrode 500C may constitute a first transistor TR1. The first transistor TR1 may be a p-type transistor. The second graphene layer 300B, the second 2D semiconductor layer 400B, the common gate electrode 100, the gate insulation layer 200, the second electrode 500B, and the other portion of the third electrode 500C may constitute a second transistor TR2. The second transistor TR2 may be an n-type transistor. The first and second transistors TR1 and TR2 may correspond to the first and second transistors TR10 and TR20 of FIG. 1, respectively.

The method of forming the first and second 2D semiconductor layers 400A and 400B described with reference to FIGS. 5C and 5D is merely an example, and various modifications may be made. For example, the first and second 2D semiconductor layers 400A and 400B may be formed via any of various methods disclosed in the Korean Patent Application No. 10-2013-0133830.

Figure 6A:
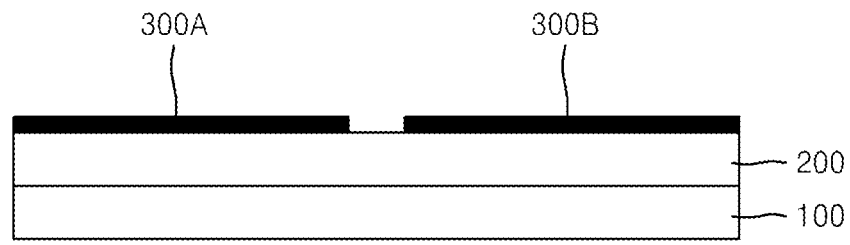
FIGS. 6A through 6C are cross-sectional views showing a method of manufacturing an inverter according to another example embodiment.
Figure 6B:
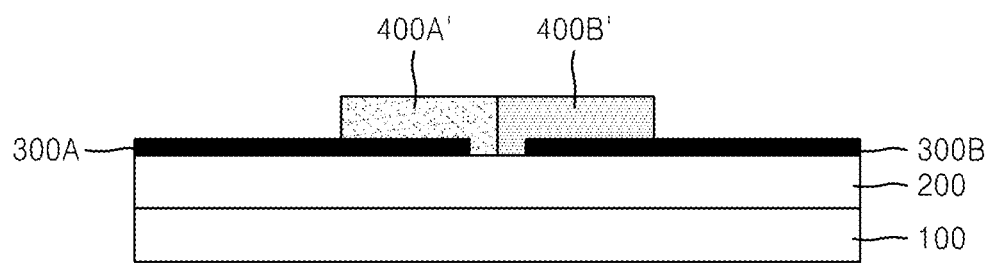
Figure 6C:
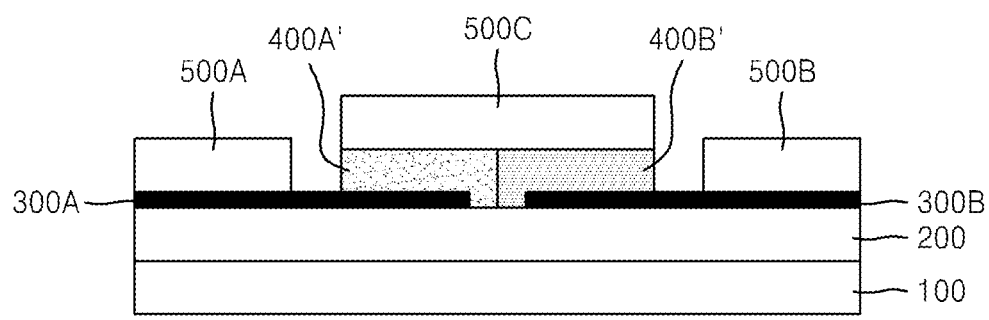

According to another example embodiment, the formation of the insulator 350 shown in FIG. 5B may be omitted. Detailed descriptions thereof will be given below with reference to FIGS. 6A through 6C. FIGS. 6A through 6C are cross-sectional views showing a method of manufacturing an inverter according to another example embodiment.

Referring to FIG. 6A, the gate insulation layer 200 may be formed on the common gate electrode 100, and the first and second graphene layers 300A and 300B that are apart from each other may be formed on the gate insulation layer 200.

Referring to FIG. 6B, first and second 2D semiconductor layers 400A' and 400B' may be formed on the first and second graphene layers 300A and 300B and the gate insulation layer 200 disposed therebetween. Formation of the first and second 2D semiconductor layers 400A' and 400B' may be the same as or similar to the formation of the first and second 2D semiconductor layers 400A and 400B of FIG. 5D. Portions of the first and second 2D semiconductor layers 400A' and 400B' may extend between the first and second graphene layers 300A and 300B and may contact the gate insulation layer 200.

Referring to FIG. 6C, the plurality of first through third electrodes 500A, 500B, and 500C may be formed on the first and second graphene layers 300A and 300B and the first and second 2D semiconductor layers 400A' and 400B'. The formation of the first through third electrodes 500A, 500B, and 500C may be the same as or similar to the formation of the first through third electrodes 500A, 500B, and 500C of FIG. 5E.

FIGS. 7A through 7D are cross-sectional views showing a method of manufacturing an inverter according to another example embodiment.

Figure 7A:
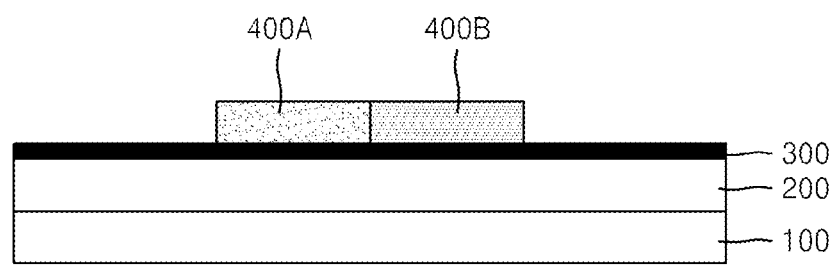
FIGS. 7A through 7D are cross-sectional views showing a method of manufacturing an inverter according to another example embodiment.

Referring to FIG. 7A, a gate insulation layer 200 may be formed on a common gate electrode 100. A graphene layer 300 may be formed on the gate insulation layer 200. Next, first and second 2D semiconductor layers 400A and 400B attached to each other may be formed on the graphene layer 300. The formation method of the first and second 2D semiconductor layers 400A and 400B may be the same as or similar to the formation method of the first and second 2D semiconductor layers 400A and 400B of FIG. 5D.

Figure 7B:
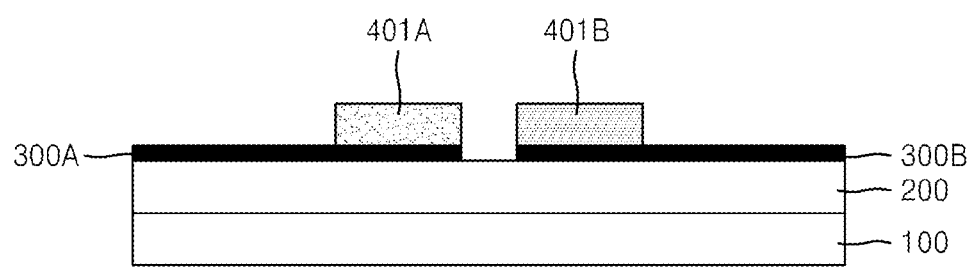

Referring to FIG. 7B, the first and second 2D semiconductor layers 400A and 400B and the graphene layer 300 may be partially etched (patterned). As a result, first and second graphene layers 300A and 300B apart from each other may be formed, and first and second 2D semiconductor layers 401A and 401B apart from each other may be formed. The first and second 2D semiconductor layers 401A and 401B apart from each other may contact the first and second graphene layers 300A and 300B, respectively.

Figure 7C:
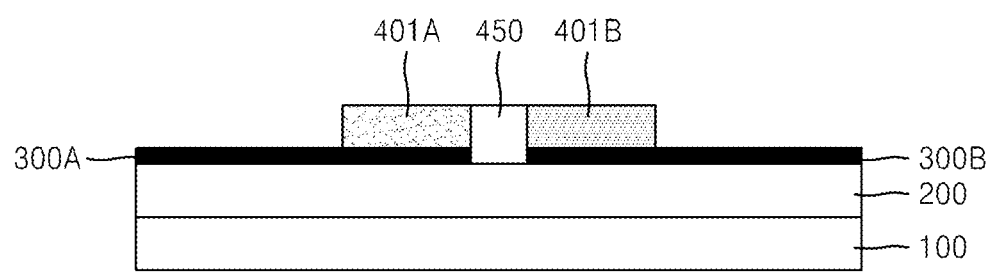

Referring to FIG. 7C, an insulator 450 may be formed between the first and second graphene layers 300A and 300B and between the first and second 2D semiconductor layers 401A and 401B. The insulator 450 may be formed of a material that is the same as or similar to the material constituting the insulator 350 of FIG. 5B. For example, the insulator 450 may be formed of a 2D material, such as h-BN. However, the material constituting the insulator 450 is not limited thereto and may vary.

Figure 7D:
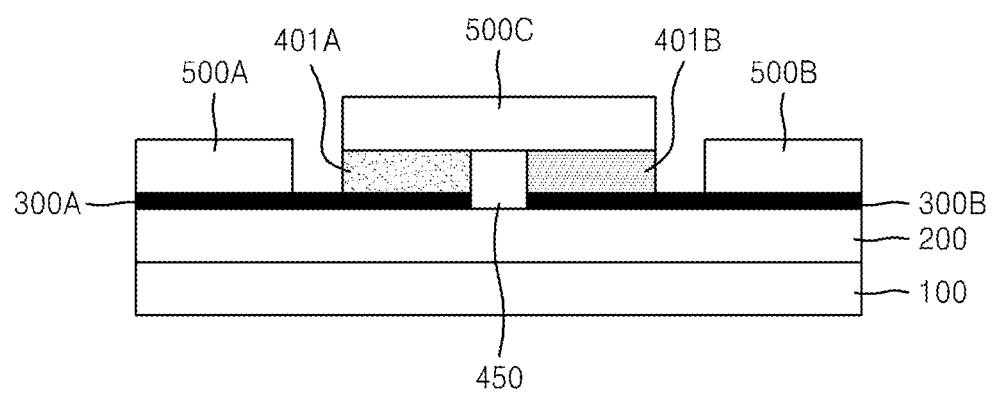

Referring to FIG. 7D, a plurality of first through third electrodes 500A, 500B, and 500C may be formed on the first and second graphene layers 300A and 300B and the first and second 2D semiconductor layers 401A and 401B. The formation of the first through third electrodes 500A, 500B, and 500C may be the same as or similar to the formation of the first through third electrodes 500A, 500B, and 500C of FIG. 5E.

Although manufacturing of an inverter on a single substrate without a transfer operation is described above, a transfer operation may be performed according to another example embodiment. An example thereof is shown in FIGS. 8A through 8D. In other words, FIGS. 8A through 8D show a method of manufacturing an inverter according to another example embodiment.

Figure 8A:
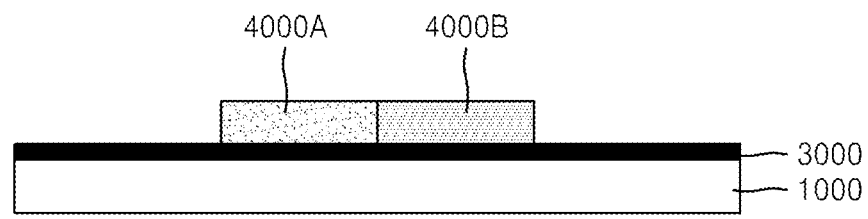
FIGS. 8A through 8D are cross-sectional views showing a method of manufacturing an inverter according to another example embodiment.

Referring to FIG. 8A, a graphene layer 3000 may be formed on a first substrate 1000. The first substrate 1000 may include a catalyst metal, such as Cu, Ni, Fe, Co, Pt, and Ru. The graphene layer 3000 may be formed on the first substrate 1000 via CVD or pyrolysis. Next, first and second 2D semiconductor layers 4000A and 4000B may be formed on the graphene layer 3000. Formation method of the first and second 2D semiconductor layers 4000A and 4000B may be the same as or similar to the formation method of the first and second 2D semiconductor layers 400A and 400B described above with reference to FIGS. 5C and 5D.

Figure 8B:
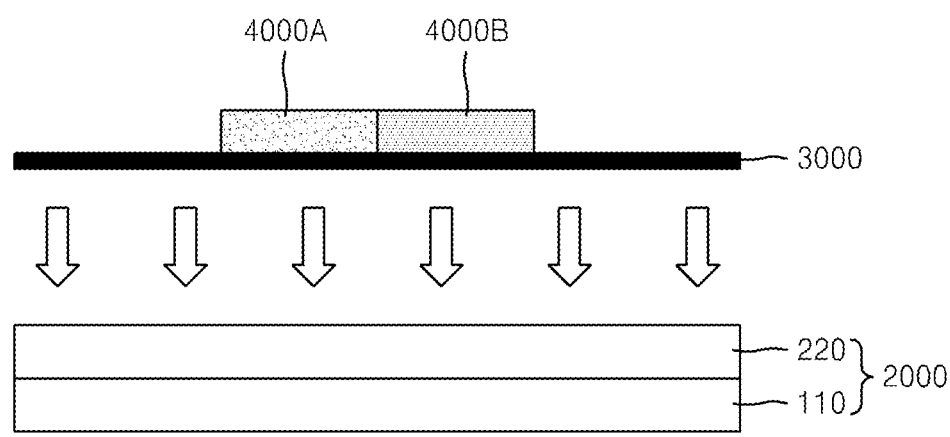

Next, the stacked structure of the graphene layer 3000 and the first and second 2D semiconductor layers 4000A and 4000B may be transferred from the first substrate 1000 to another substrate (2000 of FIG. 8B), according to at least one example embodiment. For example, after the first substrate 1000 is removed from the structure shown in FIG. 8A, the stacked structure of the graphene layer 3000 and the first and second 2D semiconductor layers 4000A and 4000B may be attached to the second substrate 2000 as shown in FIG. 8B. The transfer operation may be performed according to a general graphene transfer process. The second substrate 2000 may include a common gate electrode 110 and a gate insulation layer 220. The common gate electrode 110 may be formed of a conductive 2D material or a bulk material, which is not a 2D material. For example, the common gate electrode 110 may be formed of a metal, such as Cu, Ni, Fe, Co, Pt, and Ru, or graphene. Alternatively, the common gate electrode 110 may be formed of a doped Si. The gate insulation layer 220 may be formed of an insulating 2D material or a bulk material, which is not a 2D material. For example, the gate insulation layer 220 may be formed of an insulating 2D material, such as h-BN, or a non-2D material, such as $SiO_2$, $SiN_x$, AlN, $Al_2O_3$, $HfO_2$, and $ZrO_2$. Although not shown, a protective layer covering the graphene layer 3000 and the first and second 2D semiconductor layers 4000A and 4000B may be formed in the operation shown in FIG. 8A, and the transfer operation shown in FIG. 8B may be performed after the protection layer is formed.

Figure 8C:
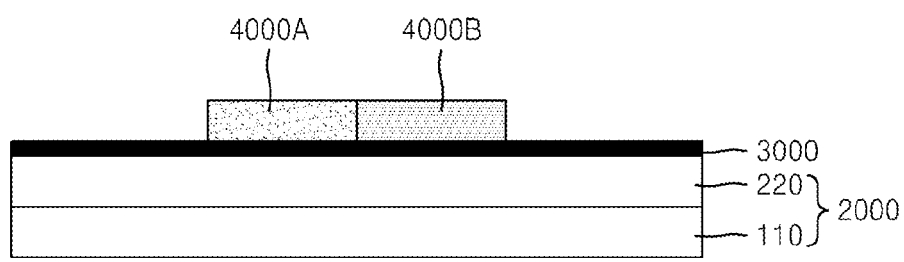
Figure 8D:
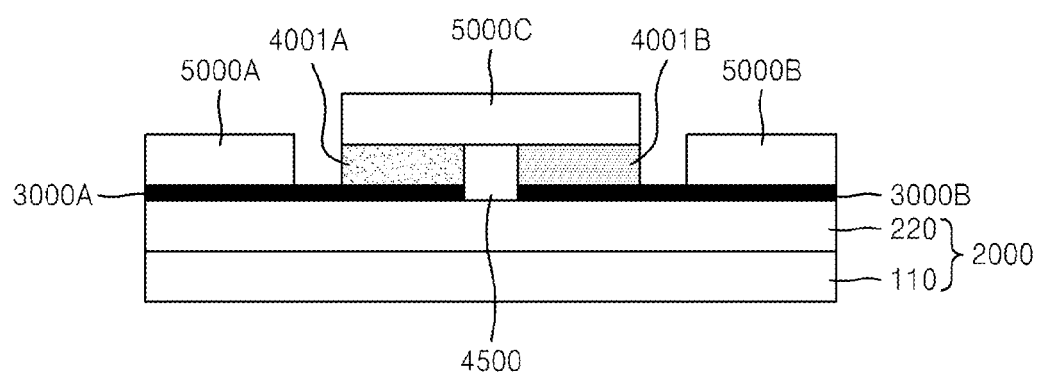

A result structure of the transfer operation is shown in FIG. 8C. Next, an inverter as shown in FIG. 8D may be obtained by performing the operations shown in FIGS. 7B through 7D with respect to the structure shown in FIG. 8C. In FIG. 8D, the reference numerals 3000A and 3000B denote first and second graphene layers, the reference numerals 4001A and 4001B denote first and second 2D semiconductor layers, and the reference numeral 4500 denotes an insulator. Furthermore, the reference numerals 5000A, 5000B, and 5000C denote first through third electrodes.

FIGS. 8A through 8D show a case in which an example transfer operation is applied to the example method shown in FIGS. 7A through 7D. The example transfer operation may also be applied to example the method shown in FIGS. 5A through 5E and the method shown in FIGS. 6A through 6C.

According to the example method described above, a 2D material-based inverter having excellent performance may be easily manufactured. In case of a vertical-type inverter in the related art, since two semiconductor layers are arranged in a vertical direction, manufacturing the inverter is typically difficult. However, according to example embodiments, an inverter in which two channel units are laterally arranged may be easily manufactured. Furthermore, in case of an inverter in the related art to which silicon is applied, a lithography process and an ion implantation process are required, and there is no technique for depositing silicon (crystalline silicon) on a 2D material. Therefore, it is necessary to use a monocrystalline silicon substrate. However, in case of an inverter according to an example embodiment, it is not necessary to perform ion implantation and it is not necessary to use a silicon substrate. Therefore, manufacturing the inverter is relatively easy and inexpensive, and the inverter may be applied to various fields. According to example embodiments, a flexible and/or transparent inverter may be easily manufactured. Furthermore, since the methods according to the example embodiments as described above may be applied to a large-scale substrate, a plurality of inverters may be easily manufactured by using a large-scale substrate. Therefore, productivity and cost efficiency may be improved.

An inverter according to an example embodiment may be used as a basic component of any of various logic devices, such as a NAND device, a NOR device, an encoder, a decoder, a multiplexer (MUX), a de-multiplexer (DEMUX), a sense amplifier, and an oscillator. Since basic structures of the above-stated logic devices are well-known in the art, detailed descriptions thereof will be omitted. Furthermore, an inverter according to an example embodiment and a logic device including the same may be applied to various semiconductor devices and electronic devices, such as memory devices, liquid crystal display devices, and organic light emitting display devices, for various purposes.

It should be understood that the example embodiments described therein should be considered in a descriptive sense only and not for purposes of limitation. Descriptions of features within each example embodiment should typically be considered as available for other same or similar features in other example embodiments. For example, one of ordinary skill in the art will understand that various modifications may be made in the configurations of the inverters as shown in FIGS. 1 through 4. For example, positions of the graphene layers GP10 and GP20 and the 2D semiconductor layers S10 and S20 may be switched, and locations and structures of the electrodes G10, E10, E20, and E30 may vary. Furthermore, each of the common gate electrode G10 and the third electrode E30 may be separated into two electrodes. Furthermore, various modifications may be made in the example methods of manufacturing 2D material elements described above with reference to FIGS. 5A through 5E, 6A through 6C, 7A through 7D, and 8A through 8D. Furthermore, inverters according to example embodiments may be applied to various semiconductor devices and electronic devices for various purposes. While one or more example embodiments have been described with reference to the figures, it will be understood by those of ordinary skill in the art that various changes in form and details may be made therein without departing from the spirit and scope example embodiments as defined by the following claims.

What is claimed is:

1. An inverter comprising a first transistor and a second transistor connected to each other,
   wherein the first transistor comprises a first channel unit,
   the first channel unit comprises a first graphene layer and a p-type first 2D semiconductor layer contacting the first graphene layer, and
   wherein the second transistor comprises a second channel unit arranged laterally with respect to the first channel unit,
   the second channel unit comprises a second graphene layer and an n-type second 2D semiconductor layer contacting the second graphene layer;
   the inverter further comprising a gate insulation layer, the first graphene layer and the second graphene layer being separated by an insulator that is separate from the gate insulation layer.

2. The inverter of claim 1, wherein the first 2D semiconductor layer is chemically bonded to a side of the second 2D semiconductor layer.

3. The inverter of claim 1, wherein the first 2D semiconductor layer and the second 2D semiconductor layer are laterally arranged and apart from each other.

4. The inverter of claim 1, wherein:
   the first 2D semiconductor layer comprises a first metal chalcogenide-based material, and
   the second 2D semiconductor layer comprises a second metal chalcogenide-based material.

5. The inverter of claim 4, wherein the first metal chalcogenide-based material and the second metal chalcogenide-based material comprise different metals.

6. The inverter of claim 4, wherein the first metal chalcogenide-based material and the second metal chalcogenide-based material comprise a same chalcogen.

7. The inverter of claim 4, wherein the first metal chalcogenide-based material comprises at least one of $WS_2$, $ZrS_2$, $ZrSe_2$, $HfS_2$, $HfSe_2$, and $NbSe_2$.

8. The inverter of claim 4, wherein the second metal chalcogenide-based material comprises at least one of $MoS_2$, $MoSe_2$, $MoTe_2$, $WSe_2$, and $WTe_2$.

9. The inverter of claim 1, wherein:
   the first and second graphene layers are apart from each other,
   the insulator is arranged between the first and second graphene layers, and
   the first and second 2D semiconductor layers are arranged on the first and second graphene layers, respectively, and on at least a portion of the insulator.

10. The inverter of claim 9, wherein the insulator comprises hexagonal boron nitride (h-BN).

11. The inverter of claim 1, wherein:
    the first and second graphene layers are arranged apart from each other, and
    a portion of the first 2D semiconductor layer and a portion of the second 2D semiconductor layer extend between the first and second graphene layers.

12. The inverter of claim 1, wherein:
    the first and second graphene layers are arranged apart from each other,
    the first and second 2D semiconductor layers are arranged apart from each other, and
    the insulator is between the first and second graphene layers and between the first and second 2D semiconductor layers.

13. The inverter of claim 1, further comprising:
    a common gate electrode apart from the first and second graphene layers;
    the gate insulation layer being between the common gate electrode and the first and second graphene layers; and
    a plurality of electrodes arranged on the first and second graphene layers and the first and second 2D semiconductor layers.

14. The inverter of claim 13, wherein the plurality of electrodes comprises:
    a first electrode on the first graphene layer and connected to a power supply terminal;
    a second electrode on the second graphene layer and grounded; and
    a third electrode on the first and second 2D semiconductor layers and connected to an output terminal.

15. The inverter of claim 13, wherein the gate insulation layer comprises a 2D material.

16. A method of manufacturing an inverter comprising first and second transistors connected to each other, the method comprising:
    forming first and second graphene layers on a substrate to be apart from each other;
    forming a p-type first 2D semiconductor layer and an n-type second 2D semiconductor layer respectively contacting the first and second graphene layers; and
    forming a plurality of electrodes on the first and second graphene layers and on the first and second 2D semiconductor layers,
    wherein the first transistor comprises the first graphene layer and the first 2D semiconductor layer, and the second transistor comprises the second graphene layer and the second 2D semiconductor layer; and
    wherein the first graphene layer and the second graphene layer are separated by an insulator that is separate from a gate insulation layer.

17. The method of claim 16, wherein the forming of the first and second 2D semiconductor layers comprises:
    forming a thin film comprising a first metal oxide and a second metal oxide; and forming a first metal chalcogenide-based material and a second metal chalcogenide-based material from the first metal oxide and the second metal oxide, respectively, wherein the first metal chalcogenide-based material constitutes the first 2D semiconductor layer, and the second metal chalcogenide-based material constitutes the second 2D semiconductor layer.

18. The method of claim 16, wherein:

the first 2D semiconductor layer is chemically bonded to a side of the second 2D semiconductor layer, or the first 2D semiconductor layer and the second 2D semiconductor layer are laterally arranged to be apart from each other.

19. The method of claim 16, wherein the substrate comprises:

a common gate electrode apart from the first and second graphene layers; and the gate insulation layer is arranged between the common gate electrode and the first and second graphene layers.

20. The method of claim 16, wherein the forming of the first and second transistors comprises:

forming a graphene layer;

forming the first and second graphene layers by patterning the graphene layer;

forming an insulator between the first and second graphene layers; and forming the first and second 2D semiconductor layers on the first and second graphene layers and the insulator.

21. The method of claim 16, wherein the forming of the first and second transistors comprises:

forming a graphene layer;

forming the first and second graphene layers by patterning the graphene layer; and forming the first and second 2D semiconductor layers on the first and second graphene layers, wherein a portion of the first 2D semiconductor layer and a portion of the second 2D semiconductor layer extend between the first and second graphene layers.

22. The method of claim 16, wherein the forming of the first and second transistors comprises:

forming a graphene layer;

forming a 2D semiconductor layer on the graphene layer;

forming the first and second 2D semiconductor layers and the first and second graphene layers by patterning the graphene layer and the 2D semiconductor layer; and forming the insulator between the first and second graphene layers and between the first and second 2D semiconductor layers.

* * * * *